United States Patent
Lee et al.

(10) Patent No.: US 9,209,122 B2
(45) Date of Patent: Dec. 8, 2015

(54) BUMP INCLUDING DIFFUSION BARRIER BI-LAYER AND MANUFACTURING METHOD THEREOF

(71) Applicant: Research & Business Foundation SUNGKYUNKWAN UNIVERSITY, Suwon-si (KR)

(72) Inventors: Hoojeong Lee, Suwon-si (KR); Byunghoon Lee, Seoul (KR)

(73) Assignee: Research & Business Foundation SUNGKYUNKWAN UNIVERSITY, Suwon-si (KR)

(*) Notice: Subject to any disclaimer, the term of this patent is extended or adjusted under 35 U.S.C. 154(b) by 165 days.

(21) Appl. No.: 13/715,124

(22) Filed: Dec. 14, 2012

(65) Prior Publication Data

US 2013/0154089 A1    Jun. 20, 2013

(30) Foreign Application Priority Data

Dec. 16, 2011 (KR) .................. 10-2011-0136347

(51) Int. Cl.
| | |
|---|---|
| H01L 23/482 | (2006.01) |
| H01L 23/498 | (2006.01) |
| H01L 21/48 | (2006.01) |
| H01L 23/00 | (2006.01) H01L 25/065 |
| (2006.01) | H01L 25/00 |
| (2006.01) | |

(52) U.S. Cl.
CPC ...... *H01L 23/49811* (2013.01); *H01L 21/4853* (2013.01); *H01L 24/11* (2013.01); *H01L 24/13* (2013.01); *H01L 25/0657* (2013.01); *H01L 25/50* (2013.01); *H01L 24/16* (2013.01); *H01L 2224/11462* (2013.01); *H01L 2224/11464* (2013.01); *H01L 2224/13005* (2013.01); *H01L 2224/13084* (2013.01); *H01L 2224/13111* (2013.01); *H01L 2224/13147* (2013.01); *H01L 2224/13155* (2013.01); *H01L 2224/16145* (2013.01); *H01L 2224/16507* (2013.01); *H01L 2225/06513* (2013.01)

(58) Field of Classification Search
CPC .......... H01L 2224/13147; H01L 2224/13611; H01L 2224/13655; H01L 2224/13084; H01L 2224/13583; H01L 2924/01029
See application file for complete search history.

(56) References Cited

U.S. PATENT DOCUMENTS

| | | | |
|---|---|---|---|
| 2007/0284740 A1* | 12/2007 | Ano | 257/738 |
| 2011/0001250 A1* | 1/2011 | Lin et al. | 257/778 |

FOREIGN PATENT DOCUMENTS

| | | |
|---|---|---|
| JP | 2005-528508 A | 9/2005 |
| KR | 1995-0001961 A | 1/1995 |
| KR | 10-2011-0002816 | 1/2011 |

OTHER PUBLICATIONS

Korean Office Action issued Nov. 23, 2012 in counterpart Korean Patent Application No. 10-2011-0136347 (4 pages, in Korean).

(Continued)

*Primary Examiner* — Shaun Campbell
*Assistant Examiner* — Raj R Gupta
(74) *Attorney, Agent, or Firm* — NSIP Law

(57) ABSTRACT

Provided herein is a bump including a diffusion barrier bi-layer, the bump having: a conductive layer; a first diffusion barrier layer formed on or above the conductive layer, and comprising an alloy of nickel and phosphorus; a second diffusion barrier formed on or above the first diffusion barrier layer, and comprising copper; and a solder layer formed on or above the second diffusion barrier layer. A manufacturing method for producing a bump is also provided.

9 Claims, 9 Drawing Sheets

(a)

(b)

(56) References Cited

OTHER PUBLICATIONS

Korean Office Action issued on Jul. 25, 2013 in counterpart Korean Patent Application No. 10-2011-0136347.

"Study of Mechanical & Electrical properties of Cu/Sn/Cu and Cu/Ni(P)/Sn/Ni(P)/Sn bonding structures." Sungkyunkwan University, Oct. 2010. (4 pages including English Abstract).
Korean Office Action issued Jan. 23, 2014 in counterpart Korean Patent Application No. 10-2011-0136347. (2 pages in Korean).

* cited by examiner (a)

(b)

(a)        (b)

(a)                      (b)

(a)            (b)            (c)

BUMP INCLUDING DIFFUSION BARRIER BI-LAYER AND MANUFACTURING METHOD THEREOF

CROSS-REFERENCE TO RELATED APPLICATIONS

This application claims the benefit of priority under 35 U.S.C. §119(a) of Korean Patent Application No. 10-2011-0136347, filed on Dec. 16, 2011, in the Korean Intellectual Property Office, the entire disclosure of which is incorporated herein by reference for all purposes.

BACKGROUND

1. Field

The following description relates to a bump including a diffusion bather bi-layer, and a manufacturing method thereof, and, for example, to a bump including a diffusion barrier bi-layer in a semiconductor 3D stacking process with a excellent mechanical intensity and reduced disintegration of a nickel-phosphorus diffusion barrier layer during a bonding process, and a method for manufacturing the same. The diffusion barrier bi-layer of the bump may be formed of a copper layer and a nickel-phosphorus alloy layer, for instance.

2. Description of Related Art

In a semiconductor 3D stacking process, the reliability of a bonding material used to connect upper and lower chips is important for obtaining a reliable bump.

In conventional bumps, a solder material 200 is deposited directly on a conductive layer 100, as in a bump 1000 illustrated in FIG. 1, or a Ni—P diffusion barrier 110 layer is disposed between a conductive layer 100 and a solder material 200, as in a bump 2000 illustrated in FIG. 2.

However, the use of a Ni—P Under-Bump Metallization (UBM) layer 110 having a thickness of 5-10 μm may not be suitable for use in a packaging bonding of the conventional solder-ball manufacturing method. The Ni—P UBM layer may be too thick for use in a semiconductor 3D stacking process where volume reduction is an issue.

Furthermore, a method of excluding a Ni—P layer 110, and bonding the copper of the conducive layer 100 directly with a solder material 200 also may cause a problem, since an intense interaction between the copper and the solder material 200 may significantly decrease the reliability of the bump 1000.

Accordingly, it is desirable to develop a diffusion barrier layer for a bump that suppresses an interaction between copper and solder material while maintaining a small volume during a semiconductor 3D stacking process.

SUMMARY

In one general aspect, there is provided a bump including a diffusion bather bi-layer, the bump comprising: a conductive layer; a first diffusion barrier layer formed on or above the conductive layer, and comprising an alloy of nickel and phosphorus; a second diffusion barrier formed on or above the first diffusion barrier layer, and comprising copper; and a solder layer formed on or above the second diffusion barrier layer.

The bump may be formed in a semiconductor 3D stacking process.

In the general aspect of the bump, a thickness of the first diffusion barrier layer may range from 0.8 μm to 1.6 μm, and a thickness of the second diffusion bather layer may range from 0.4 μm to 0.8 μm.

In the general aspect of the bump, the conductive layer may comprise copper (Cu), and the solder layer may comprise tin (Sn).

In the general aspect of the bump, a thickness of the conductive layer may range from 20 μm to 60 μm, and a thickness of the solder layer may range from 3 μm to 10 μm.

In another general aspect, there is provided a manufacturing method of a bump including a diffusion barrier bi-layer, the method involving: forming a conductive layer by depositing copper on or above an object in an electroplating method; forming a first diffusion barrier layer by depositing an alloy of nickel and phosphorus on or above the conductive layer in an electroless-plating method; forming a second barrier layer by depositing copper on or above the first diffusion barrier layer in an electroplating method; and forming a solder layer by depositing tin (Sn) on or above the second diffusion barrier layer.

In the general aspect of the manufacturing method, a semiconductor 3D stacking process may be applied to form the bump.

In the general aspect of the manufacturing method, the first diffusion barrier layer may be deposited to have a thickness of 0.8 μm to 1.6 μm.

In the general aspect of the manufacturing method, the second diffusion barrier layer may be deposited to have a thickness of 0.4 μm to 0.8 μm.

Other features and aspects may be apparent from the following detailed description, the drawings, and the claims.

Figure 1:
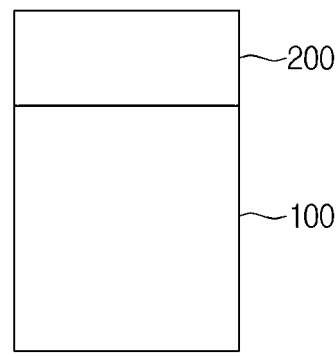
FIG. 1 is a cross-sectional view illustrating a bump that does not include a diffusion barrier layer.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

In an example of a bump and the manufacturing method thereof described below, the reliability problem caused due to the degradation resulting from an interaction between copper and a solder material may be relieved or improved. According to an example, a bump including a diffusion barrier bi-layer formed in a semiconductor 3D stacking process is provided, which may minimize the increase of thickness that is important in using a semiconductor 3D stacking process. The reduction of thickness may be obtained by depositing a thin layer of copper on a diffusion bather layer of a nickel-phosphorus alloy to form a double layer. In some examples, a bump including a diffusion barrier bi-layer is provided in a semiconductor 3D stacking process, which may delay the disintegration of the diffusion barrier layer by overcoming the degradation of the diffusion barrier effect caused by the crystallization of the diffusion barrier layer of a nickel-phosphorus alloy during a bonding process at a high temperature.

For example, an intermetallic compound that is generated by a reaction between copper, which is a constituent material of a diffusion barrier layer of some examples, and a solder layer, plays a role of preventing diffusion of nickel, thereby increasing the diffusion barrier effect. Accordingly, a bump including a diffusion barrier bi-layer according to examples below may improve the reliability of a product obtained through the semiconductor 3D stacking process.

Further, a bump including a diffusion barrier bi-layer according certain examples described below is suitable for a semiconductor 3D stacking process, since it includes the diffusion barrier bi-layer, but with only a slight increase in the thickness of the diffusion barrier layer. Furthermore, a bump including a diffusion barrier bi-layer in a semiconductor 3D stacking process may significantly improve a mechanical intensity, as described below.

An example of a bump including a diffusion barrier bi-layer in a semiconductor 3D stacking process described below includes: a conductive layer; a first diffusion barrier layer that is formed on the conductive layer, and includes nickel and phosphorus; a second diffusion barrier layer that is formed on the first diffusion barrier layer, and includes copper; and a solder layer that is formed on the second diffusion barrier layer.

A thickness ratio of the first diffusion barrier layer and the second diffusion barrier layer is characterized to be 1.2:1 to 2.5:1, and a thickness of the first diffusion barrier layer is characterized to be 0.8 μm to 1.6 μm, while a thickness of the second diffusion barrier layer is characterized to be 0.4 μm to 0.8 μm.

Furthermore, the conductive layer may include copper as the major constituent, while the solder layer may include tin (Sn), and a thickness of the conductive layer may range from 20 μm to 60 μm, while a thickness of the solder layer may range from 3 μm to 10 μm.

According to an example of bump including a diffusion barrier bi-layer in a semiconductor 3D stacking process described below and a manufacturing method thereof, it is possible to reduce the increase in the thickness of the diffusion barrier layer by depositing a thin copper layer on a diffusion barrier layer of a nickel-phosphorus alloy. The disintegration of the diffusion barrier layer may be also suppressed with the formation of the bi-layer by overcoming the degradation of diffusion barrier effect caused by the crystallization of the diffusion barrier layer of nickel-phosphorus alloy during a bonding process that occurs at a high temperature.

In an example of bump described below, the diffusion of nickel through an intermetallic compound generated by a reaction between copper may be prevented or reduced, thereby increasing the diffusion barrier effect and thus significantly improving the reliability of a product completed through a semiconductor 3D stacking process.

Furthermore, in an example of a bump described below, a diffusion barrier bi-layer is provided, but the bi-layer cause only a slight increase of the thickness of the diffusion barrier layer. Thus, the bi-layer is suitable for use in a semiconductor 3D stacking process and may also significantly improve the mechanical strength of the diffusion barrier layer.

Figure 3:
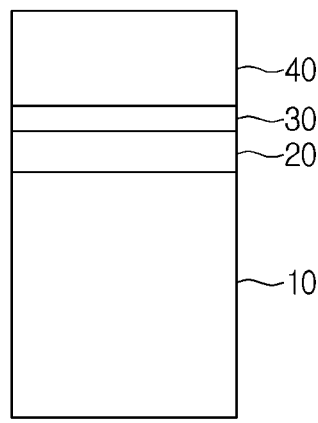
FIG. 3 is a cross-sectional view illustrating an example of a bump including a diffusion barrier bi-layer.

As illustrated in FIG. 3, in an example of a bump including a diffusion barrier bi-layer in a semiconductor 3D stacking process, the bump 3000 includes a conductive layer 10, a first diffusion barrier layer 20, a second diffusion barrier layer 30, and a solder layer 40.

The conductive layer 10 may consist of various materials. In this example, the conductive layer 10 includes copper as the major constituent. For instance, the conductive layer 10 may comprise 90 wt % or more, or 99-100 wt % copper.

A thickness of the conductive layer 10 may be desirably 20 μm to 60 μm, more desirably 30 μm to 50 μm, and most desirably 40 μm. If the thickness of the conductive layer 10 goes beyond this range, the conductive layer may not function effectively.

Furthermore, the first diffusion barrier layer 20 is desirably formed on the conductive layer 10, and desirably includes an alloy of nickel and phosphorus. This is to prevent the degradation of reliability caused by a reaction between the conductive layer and the solder layer, by generating an intermetallic compound through a reaction between nickel and solder material in a bonding process at a high temperature, thereby preventing diffusion.

A thickness of the first diffusion barrier layer 20 is desirably 0.8 μm to 1.6 μm, more desirably 1.0 μm to 1.4 μm, and most desirably 1.2 μm. In a case where a thickness of the first diffusion barrier layer 20 is less than 0.8 μm, a portion of the diffusion barrier layer may burst and become dysfunctional, as shown in experiment results explained below. If a thickness of the first diffusion barrier layer 20 exceeds 1.6 μm, a total thickness of a diffusion barrier bi-layer becomes thick, and thus becomes not suitable for bonding in a semiconductor 3D stacking process.

In addition, the second diffusion barrier layer 30 is characterized to be formed on the first diffusion barrier layer 20, and is characterized to include copper. The second diffusion barrier layer 30 is additionally formed on the diffusion barrier layer of nickel-phosphorus alloy to form a bi-layer, and generates an intermetallic compound of copper and solder material, thereby preventing diffusion of nickel and delaying the disintegration of the diffusion barrier layer due to crystallization of the intermetallic compound caused by reaction of the nickel-phosphorus with the solder material. This may be applied to a semiconductor 3D stacking process with a very thin thickness and improved reliability.

A thickness of the second diffusion barrier layer 30 is desirably 0.4 μm to 0.8 μm, more desirably 0.4 μm to 0.6 μm, and most desirably 0.5 μm. If the thickness of the second diffusion barrier layer 30 is less than 0.4 μm, it may be difficult to fully perform a role of preventing diffusion of nickel as a bi-layer. Meanwhile, if the thickness of the second diffusion barrier layer 30 exceeds 0.8 μm, a reaction is conducted between the solder material and the second diffusion barrier layer only, and not with the first diffusion barrier layer, in which case the effect of a bi-layer cannot be realized.

That is, a thickness ratio of the first diffusion barrier layer 20 and the second barrier layer 30 is desirably 1.2:1 to 2.5:1, more desirably 1.8:1 to 2.4:1, and most desirably 2.4:1. If a ratio of either side of the two layers increases, there is a problem that the excellent diffusion barrier effect of a bi-layer cannot be realized as mentioned above.

Therefore, as the first diffusion barrier layer 20 and the second diffusion barrier layer 30 play complementary roles to each other, a limitation that cannot be resolved by using one diffusion barrier layer may be resolved, thereby increasing reliability. Furthermore, a semiconductor 3D stacking process that requires thin thickness may be utilized.

Next, the solder layer 40 is characterized to be formed on the second diffusion barrier layer 30. The solder layer 40 functions in a same manner as a solder layer of a conventional bump.

The solder layer 40 may consist of any material that can be used as solder material. However, in one example, it includes tin (Sn) so as to maximize the effects of improved reliability and reduced thickness. For example, the solder layer 40 may include 50 wt % or more Sn, 70 wt % or more Sn, or 90 wt % or more Sn.

A thickness of the solder layer 40 is desirably 3 μm to 10 μm, more desirably 5 μm to 8 μm, and most desirably 7 μm. If the thickness of the solder layer 40 goes beyond this thickness range, the solder layer may not function effectively.

Figure 4:
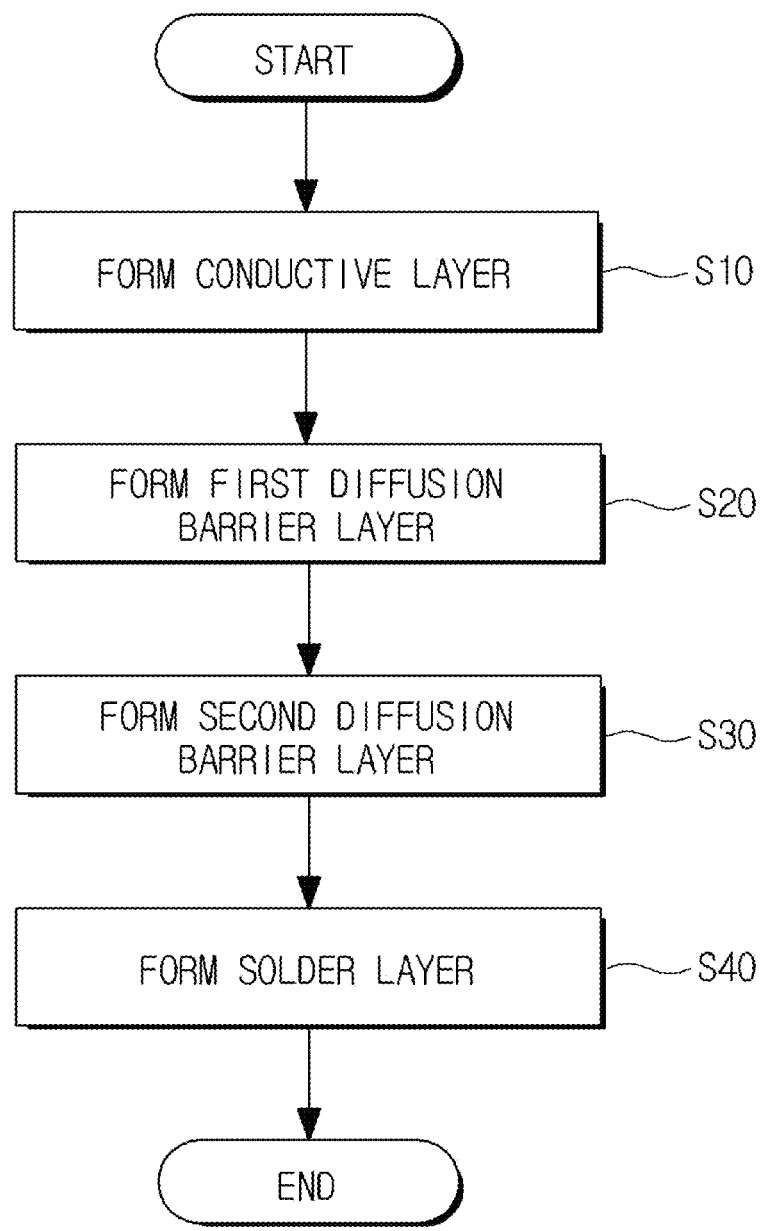
FIG. 4 is a flowchart sequentially illustrating an example of a manufacturing method of a bump including a diffusion barrier bi-layer.

Next, an example of a manufacturing method of a bump including a diffusion barrier bi-layer in a semiconductor 3D stacking process is described with respect to FIG. 4. The manufacturing method may involve: forming a conductive layer (S10), forming a first diffusion barrier layer (S20), forming a second barrier layer (S30), and forming a solder layer (S40). Any portion of the above not explained hereinbelow corresponds to the aforementioned explanation on the bump including a diffusion barrier bi-layer in a semiconductor 3D stacking process described above.

The forming a conductive layer (S10) may involve a step of depositing a copper layer on an object in an electroplating method to form a conductive layer. This process may form, for example, the conductive layer 10 illustrated in FIG. 3.

Herein, the object is used for depositing the conductive layer. Any object may be used for the purpose of depositing the conductive layer, and may then be removed afterwards.

Various methods may be used for the deposition of the conductive layer. However, since copper is used in this example, the electrolysis-plating method is desirable.

Next, the forming of a first diffusion barrier layer (S20) may involve a step of depositing an alloy of nickel and phosphorus on the conductive layer in an electroless-plating method to form a first diffusion barrier layer. This process results in a nickel-phosphorus diffusion barrier layer, which is first diffusion barrier layer 20. An electroless plating method uses a redox reaction to deposit a metal on an object without the passage of an electric current. For example, the object may be immersed in a bathe and exposed to a constant metal ion concentration to deposit the metal in an even thickness. The process may rely on the presence of a reducing agent, for example hydrated sodium hypophosphite (NaPO2H2.H2O) which reacts with metal ions to deposit the metal. The alloy may have a phosphorus content ranging from 2 to 13 wt %, or from 10 to 13 wt %.

The first diffusion barrier layer 20 may be deposited as a nickel and phosphorus alloy layer, in which case the electroless-plating method may be employed.

At the step of forming the first diffusion barrier layer (S20), it is desirable that the first diffusion barrier layer is deposited to have a thickness of 0.8 μm to 1.6 μm, due to the reason mentioned above.

Next, the forming a second diffusion barrier layer (S30) may involve a step of depositing copper on the first diffusion barrier layer 20 in the electroplating method to form a second diffusion barrier layer 30. This process results in a bi-layer including a first diffusion barrier layer 20 and a second diffusion barrier layer 30.

In the example in which copper is deposited on the first diffusion barrier layer 20, it is most desirable to use the electroplating method.

At the step of forming a second diffusion barrier layer (S30), it is desirable that the second diffusion barrier layer 30 be deposited to have a thickness of 0.4 μm to 0.8 μm, due to the reason mentioned hereinabove.

Lastly, the forming a solder layer (S40) may involve a step of depositing tin (Sn) on the second diffusion barrier layer 30 in the electroplating method to form a solder layer 40. This process results in a solder layer 40 above the second diffusion barrier layer 30.

Since tin (Sn) is deposited on the second diffusion barrier layer 30, it is desirable to use the electroplating method, and the thickness thereof is as mentioned hereinabove.

Figure 2:
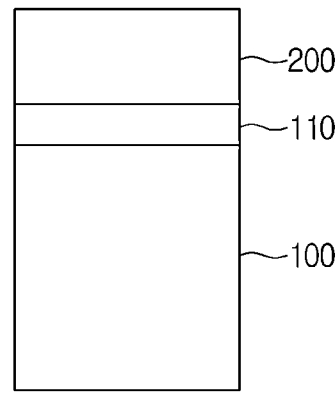
FIG. 2 is a cross-sectional view illustrating a bump that includes a Ni—P diffusion barrier layer only.

Hereinbelow is an explanation of results evidencing the excellence of the bump obtained by the above described method obtained through conducting experiments to measure the reliability on a bump including a diffusion barrier bi-layer in a semiconductor 3D stacking process, in comparison to bumps formed without the diffusion barrier bi-layer illustrated in FIGS. 1 and 2.

Figure 5:
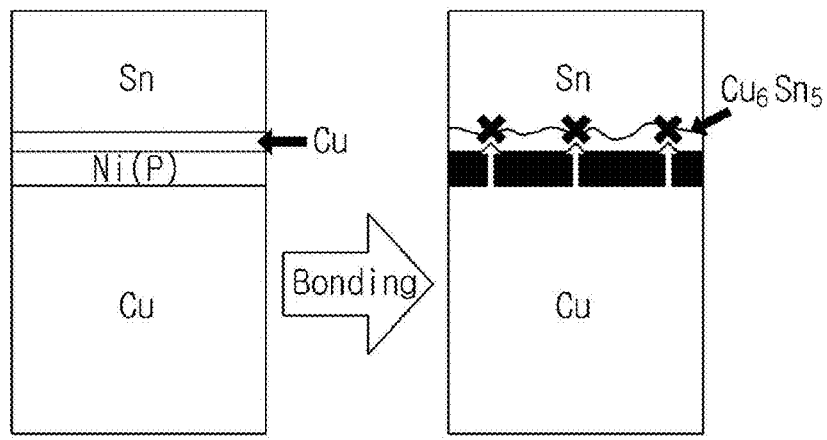
FIG. 5 is a reaction mimetic diagram and SEM photographs of an example of a bump including a diffusion barrier bi-layer in a semiconductor 3D stacking process.
Figure 5:
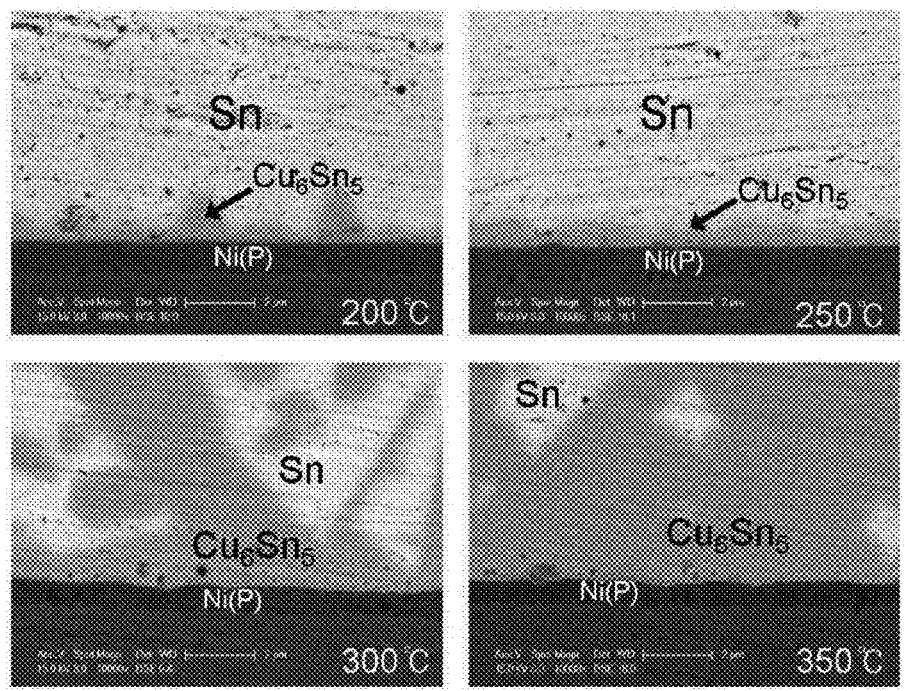

Referring to FIG. 5, it has been found that a bump including a diffusion barrier bi-layer forms a $Cu_6Sn_5$ layer by a reaction between the copper and the tin material at the interface between the diffusion barrier bi-layer and the solder layer, as illustrated in FIG. 5(a). The reaction of copper (Cu) and tin (Sn) occurs during a high temperature plating process at a temperature of 200° C. or above, and the reaction results in the formation of a $Cu_6Sn_5$ layer that controls the diffusion of nickel. FIG. 5(b) illustrates a magnification of the structure photographed through SEM after the reaction.

Figure 6:
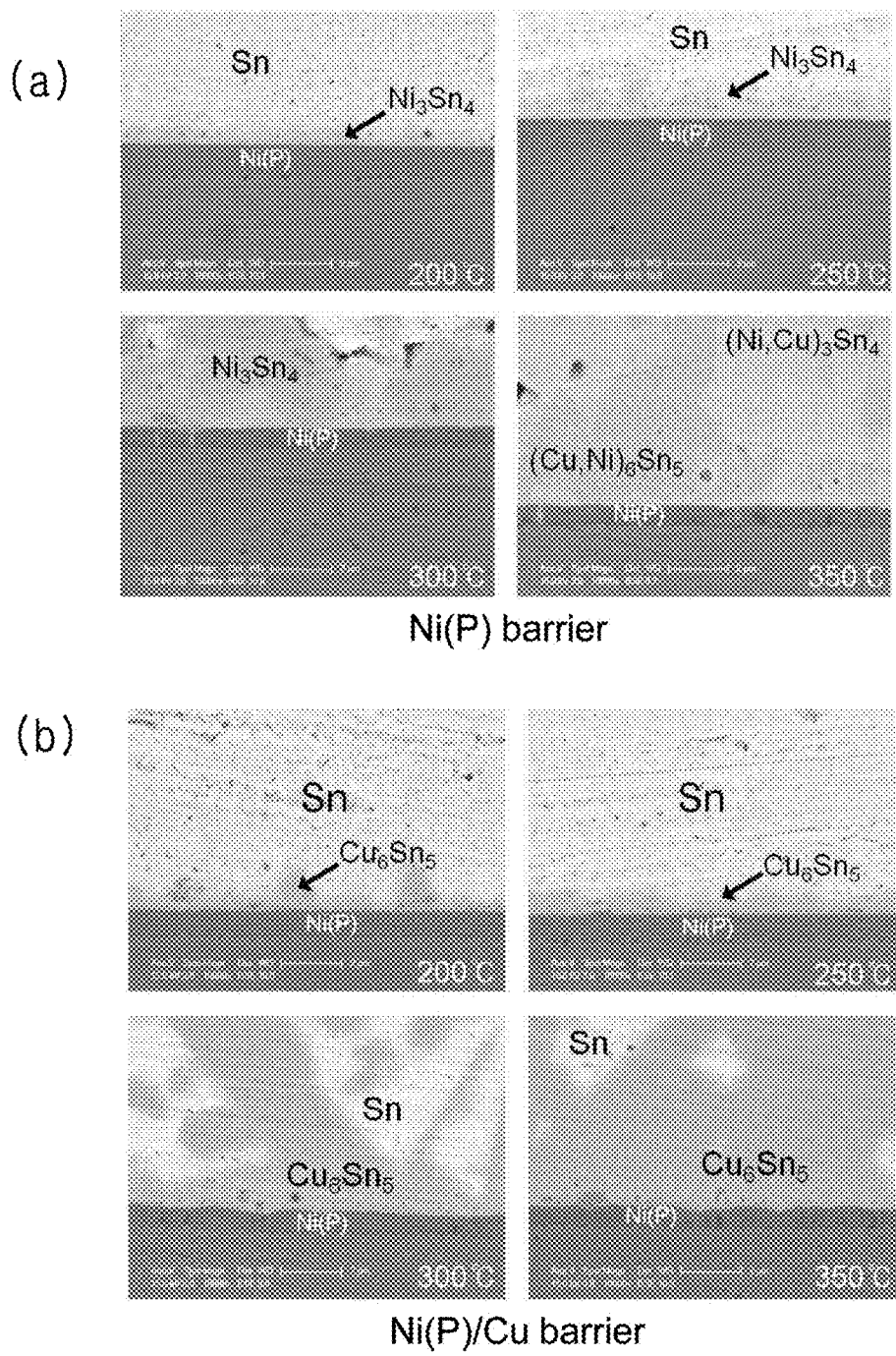
FIGS. 6(a) and 6(b) are SEM photographs depicting magnified structures of an example of a bump including a diffusion barrier bi-layer and a bump including only a Ni—P diffusion barrier layer, after their reactions.

FIG. 6 illustrates results of observing the magnified structures through SEM with the application of various temperatures. FIG. 6(a) includes SEM photographs taken after reactions that formed a bonding in a bump that uses a conventional Ni—P diffusion barrier layer, and FIG. 6(b) includes SEM photographs taken after reactions in a bonding in a bump that uses a diffusion barrier bi-layer. As illustrated in FIGS. 6(a) and 6(b), it has been found that, in comparison to the bonding that uses a conventional Ni—P diffusion barrier layer, the bonding that used a diffusion barrier bi-layer has a slower reaction speed, has different types of intermetallic compounds formed by interfacial reactions, and has a tin (Sn) layer above even after applying at a high temperature of 350° C.

That is, it has been proved that a bonding that uses a diffusion barrier bi-layer suppresses the diffusion of copper and nickel far more effectively than a bonding that uses only a Ni—P diffusion barrier layer.

Next, as illustrated in FIGS. 7(a) and (b), in the bonding that uses only a Ni—P diffusion barrier layer, a phenomenon in which a portion of the diffusion barrier layer broke down occurred at a high temperature of 350° C. On the other hand, in the bonding that uses a diffusion barrier bi-layer, the diffusion barrier layer was intact even after applying a high temperature of 350° C., as illustrated in FIG. 7(b). Thus, the use of a diffusion barrier bi-layer may significantly improve the reliability of the bump.

Figure 8:
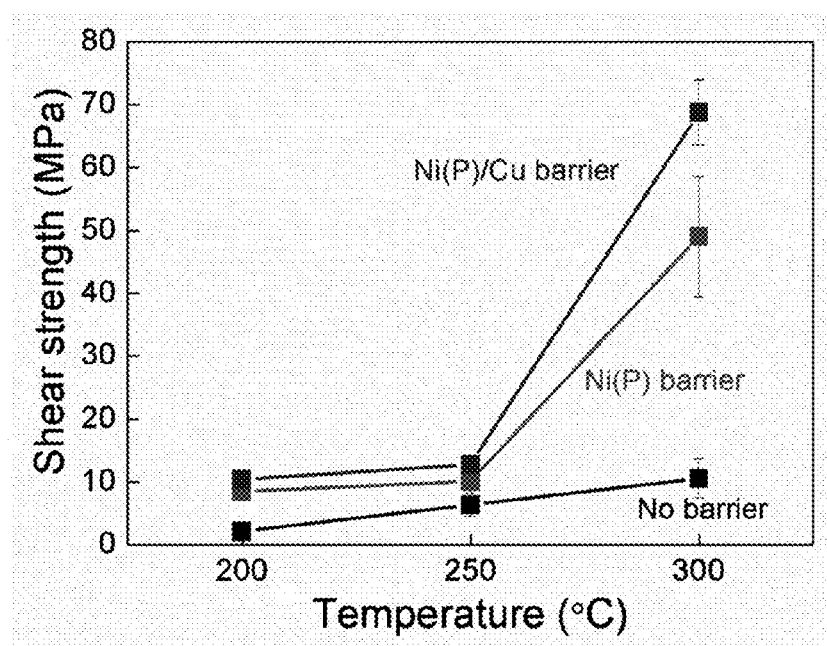
FIG. 8 is a graph illustrating results of experiments evaluating mechanical intensities according to various temperatures, in a bump not using a diffusion barrier layer, in a bump using a Ni—P diffusion bather layer only, and in a bump using a diffusion barrier bi-layer.

Furthermore, FIG. 8 illustrates a result of evaluating mechanical strength of a bump not using a diffusion barrier layer, a bump using a Ni—P diffusion barrier layer only, and a bump using a diffusion barrier bi-layer, through a Lap-Shear Test. As illustrated in FIG. 8, it has been found that the higher the temperature, a mechanical strength of a diffusion barrier bi-layer improved by approximately 200% or more than the bump not using a diffusion barrier layer, and approximately 40% or more than the bump using a Ni—P diffusion barrier layer only.

Therefore, a diffusion barrier bi-layer has been proved to significantly improve its mechanical intensity of the bump.

Figure 9:
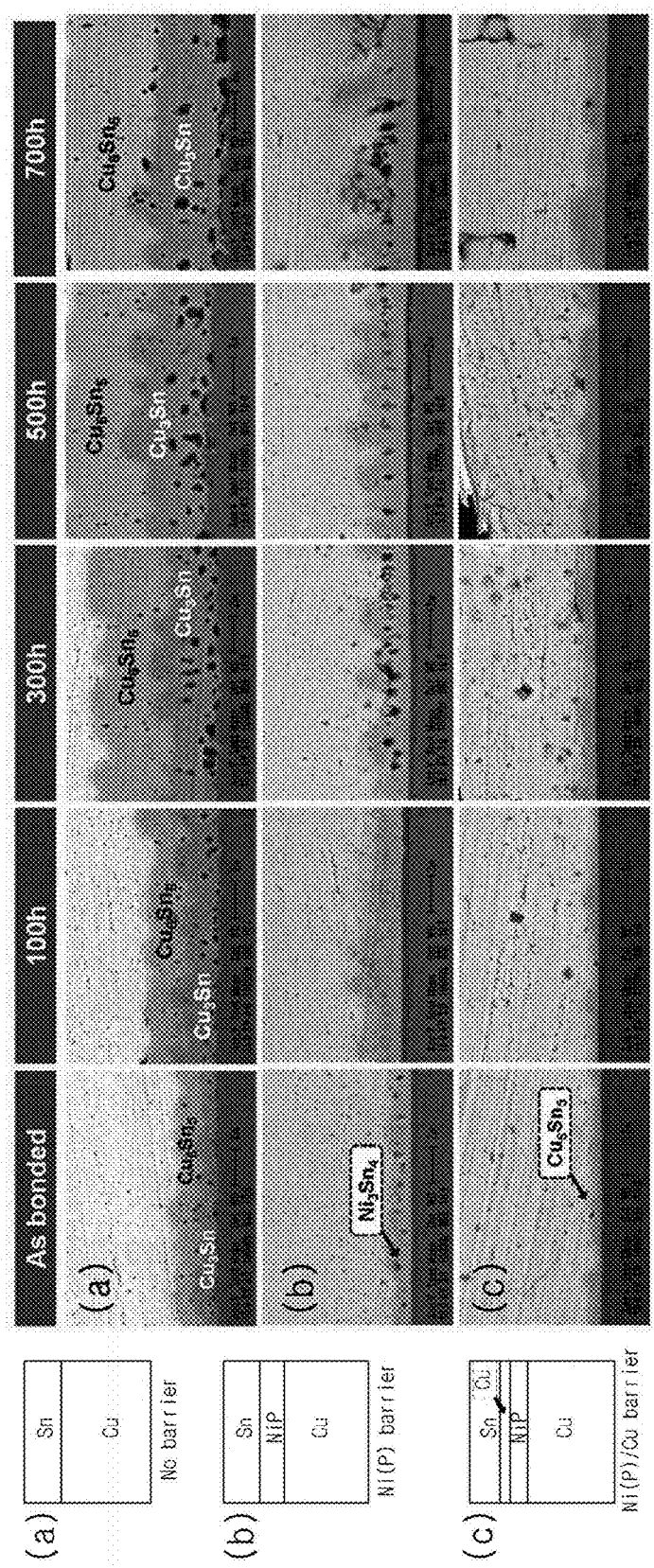
FIG. 9 includes SEM photographs of Isothermal aging test results conducted for reliability evaluations on (a) a bump not using a diffusion barrier layer, (b) a bump using a conventional Ni—P diffusion barrier layer only, and (c) a bump using a diffusion barrier bi-layer.

Next, FIG. 9 is a result of an Isothermal aging test conducted to evaluate the reliability of a bump (a) not using a diffusion barrier layer, (b) using a conventional Ni—P diffusion barrier only, and (c) using a diffusion barrier bi-layer. In a bump of case (a), it can be seen that a thickness of an intermetallic compound increases rapidly with time, and that numerous Kirkendall Voids are generated. In the bump of case (b), it can be seen that although an increase speed of an intermetallic compound is relatively slow, numerous cracks are formed due to use of nickel.

On the other hand, in the bump of case (c), it can be seen that a thin $Cu_6Sn_5$ layer formed on a nickel layer suppresses the diffusion of metal and the generation of intermetallic compounds, and the generation of Kirkendal Void very effectively.

Therefore, the present experiment results proved that the diffusion barrier bi-layer described above may resolve problems of structures illustrated in FIGS. 9(a) and (b).

Figure 10:
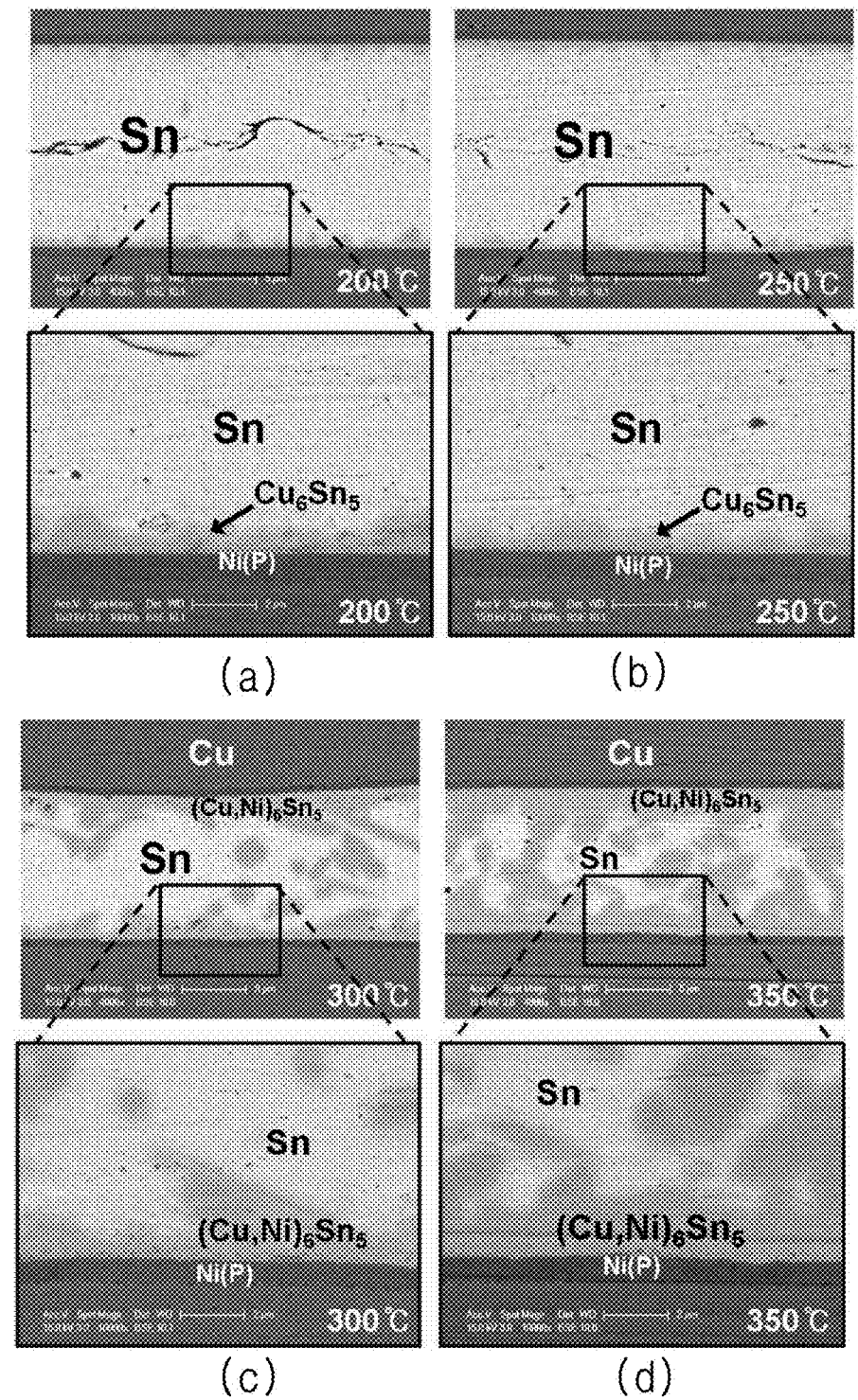
FIG. 10 includes SEM photographs of morphological changes according to various bonding temperatures of a diffusion barrier bi-layer.

FIG. 10 illustrates a result of observing morphological changes according to various bonding temperatures in a diffusion bather bi-layer. Up until approximately 250° C., most of the bonded portions remain in pure Sn states, and the generated intermetallic compounds consist of $Cu_6Sn_5$, improving reliability. In addition, it can be seen that even at a high temperature of approximately 350° C., there exists a Sn layer in which phase changes do not take place, and Kirkendall Void is effectively suppressed.

Figure 11:
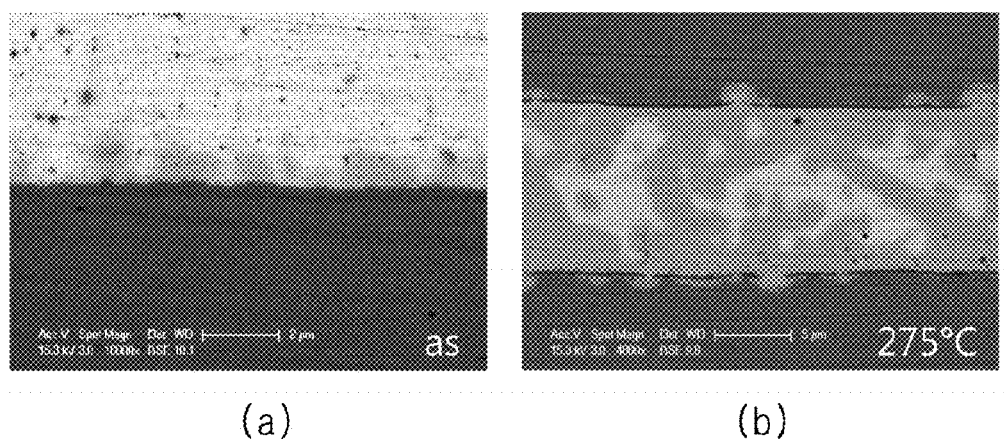
FIGS. 11(a) and 11(b) are SEM photographs of diffusion barrier bi-layers according to an example of a bump after depositing a first diffusion barrier layer of approximately 0.5 μm and after a reaction between a conductive layer and a solder material, respectively.
Figure 12:
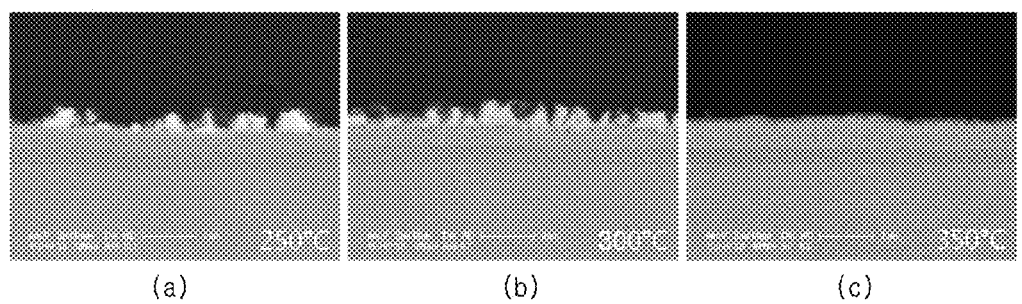
FIGS. 12(a), 12(b) and 12(c) are SEM photographs of a diffusion barrier bi-layer according to one example after depositing a second diffusion barrier layer of approximately 1.0 μm and after a reaction between a conductive layer and a solder material, respectively.

The following experiment demonstrates a critical significance of a thickness of a first diffusion barrier layer and a second diffusion barrier layer of a diffusion barrier bi-layer, and a result thereof is as illustrated in FIGS. 11 and 12.

Figure 7:
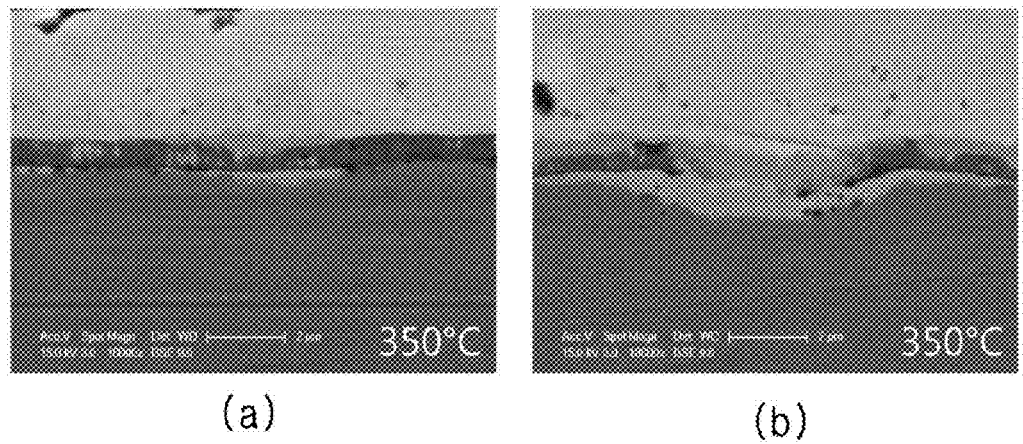
FIGS. 7(a) and 7(b) are SEM photographs depicting a disintegration phenomenon in an example of a bump including a diffusion barrier bi-layer and in a bump including a Ni—P diffusion barrier layer only.

First of all, with reference to FIG. 11, it can be seen that when a first diffusion barrier layer is deposited to have a thickness of approximately 0.5 μm on a diffusion barrier bi-layer, a section of the diffusion barrier layer bursts even at a relatively low temperature of approximately 275° C. This is in contrast to the example where a bursting of the diffusion barrier layer doesn't take place if a first diffusion barrier layer is deposited to have a thickness of 1 μm, which is within the thickness range used in the above described bump examples, as illustrated in FIG. 7.

Therefore, it has been proved that a first diffusion barrier layer has a critical significance of preventing a diffusion barrier layer from breaking at approximately 1 μm of thickness.

Next, referring to FIG. 12, when a diffusion barrier bi-layer was deposited with a second diffusion barrier layer 30 of approximately 1 μm, a thickness of copper which is the second diffusion barrier layer was formed too thick in a 3D plating structure having a thin Sn solder. Accordingly, it can be seen that a reaction occurred between only the second diffusion barrier layer 30 and cooper, dissipating the effect of the first diffusion barrier layer 20.

Therefore, when a thickness of a second diffusion barrier layer 30 is approximately 1 μm or greater, the bi-layer effect is significantly reduced. Especially, it has been proved that excellent diffusion barrier effects can be realized when the thickness of a second diffusion barrier layer is approximately 0.5 μm, as in the aforementioned experiment results.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

DESCRIPTION OF REFERENCE NUMERALS

100: CONDUCTIVE LAYER (Cu PILLAR)
110: DIFFUSION BARRIER LAYER (Ni—P)
200: SOLDER LAYER (Sn)
10: CONDUCTIVE LAYER
20: FIRST DIFFUSION BARRIER LAYER
30: SECOND DIFFUSION BARRIER LAYER
40: SOLDER LAYER

What is claimed is:

1. A bump including a diffusion barrier bi-layer, the bump comprising:
   a conductive layer;
   a first diffusion barrier layer formed on or above the conductive layer, and comprising an alloy of nickel and phosphorus;
   a second diffusion barrier layer formed on or above the first diffusion barrier layer, and comprising copper;
   a solder layer formed on or above the second diffusion barrier layer, and comprising tin; and
   an intermetallic $Cu_6Sn_5$ layer formed by reacting the second diffusion barrier layer with the solder layer,
   wherein a thickness of the first diffusion barrier layer ranges from about 1 μm to 1.6 μm, and a thickness of the second diffusion barrier layer ranges from about 0.5 μm to 0.8 μm, and
   wherein a thickness ratio of the first diffusion barrier layer and the second diffusion layer ranges from 1.2:1 to 2.5:1.

2. The bump according to claim 1, wherein the bump is formed in a semiconductor 3D stacking process.

3. The bump according to claim 1, wherein the conductive layer comprises copper (Cu), and the solder layer comprises tin (Sn).

4. The bump according to claim 1, wherein a thickness of the conductive layer ranges from 20 μm to 60 μm, and a thickness of the solder layer ranges from 3 μm to 10 μm.

5. A manufacturing method for manufacturing the bump according to claim 1, the method comprising:
- forming the conductive layer by depositing copper on or above an object in an electroplating method;
- forming the first diffusion barrier layer by depositing an alloy of nickel and phosphorus on or above the conductive layer in an electroless-plating method;
- forming the second barrier layer by depositing copper on or above the first diffusion barrier layer in an electroplating method; and
- forming the solder layer by depositing tin (Sn) on or above the second diffusion barrier layer.

6. The manufacturing method according to claim 5, wherein a semiconductor 3D stacking process is applied to form the bump.

7. The manufacturing method according to claim 5, wherein the first diffusion barrier layer is deposited to have a thickness of 0.8 μm to 1.6 μm.

8. The manufacturing method according to claim 5, wherein the second diffusion barrier layer is deposited to have a thickness of 0.4 μm to 0.8 μm.

9. The manufacturing method according to claim 5, wherein the second diffusion barrier layer is deposited to have a thickness of 0.4 μm to 0.8 μm.

\* \* \* \* \*